(12) United States Patent
Test et al.

(10) Patent No.: US 6,268,662 B1
(45) Date of Patent: Jul. 31, 2001

(54) WIRE BONDED FLIP-CHIP ASSEMBLY OF SEMICONDUCTOR DEVICES

(75) Inventors: Howard R. Test; Wei-Yan Shih, both of Plano; Willmar Subido, Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/418,042

(22) Filed: Oct. 14, 1999

Related U.S. Application Data

(60) Provisional application No. 60/104,254, filed on Oct. 14, 1998.

(51) Int. Cl.⁷ ............................ H01L 23/48; H01L 23/52; H01L 29/40
(52) U.S. Cl. ..................... 257/784; 257/773; 257/786; 437/117; 437/578; 437/617
(58) Field of Search ............................. 257/780, 781, 257/783, 784, 773, 786, 693, 696; 438/117, 578, 579, 617

(56) References Cited

U.S. PATENT DOCUMENTS

| | | |
|---|---|---|
| 5,917,707 * | 6/1999 | Khnadros et al. . |
| 5,952,727 * | 9/1999 | Takano et al. . |
| 5,962,918 * | 10/1999 | DiStefano et al. . |
| 5,977,643 * | 11/1999 | You et al. . |
| 6,023,103 * | 2/2000 | Chang et al. . |
| 6,107,682 * | 8/2000 | Fjelstad . |

* cited by examiner

Primary Examiner—Shelia V. Clark
(74) Attorney, Agent, or Firm—Gary C. Honeycutt; Fred Telecky; Arthur I. Navarro

(57) ABSTRACT

A semiconductor assembly comprising a semiconductor chip having an active and a passive surface, said active surface including an integrated circuit and a plurality of bonding pads; said bonding pads having a metallization suitable for wire bonding; an array of interconnects of uniform height, each of said interconnects comprising a wire loop substantially perpendicular to said active surface, each of said loops having both wire ends attached to a bonding pad, respectively, and a major and a minor diameter, said loops being oriented parallel with regard to the plane of the opening and having constant offsets in both direction and magnitude of their apex relative to their bonding pad centers; said wire loops having sufficient elasticity to act as stress-absorbing springs; an electrically insulating substrate having first and second surfaces, a plurality of electrically conductive routing strips integral with said substrate, and a plurality of contact pads disposed on said first surface, with attachment material disposed on each of said contact pads; each contact pad being attached to one of said wire loops, respectively, such that electrical contact between said chip and said substrate is established, while forming a gap therebetween having a width of approximately said major loop diameter; encapsulation material within said gap; a plurality of contact pads disposed on said second surface of said substrate; and solder balls attached to each of said contact pads disposed on said second surface of said substrate.

17 Claims, 2 Drawing Sheets

WIRE BONDED FLIP-CHIP ASSEMBLY OF SEMICONDUCTOR DEVICES

This application claims priority under 35 USC § 119 based upon Provisional patent application Ser. No. 60/104, 254, filed Oct. 14, 1998.

The present invention is related in general to the field of semiconductor devices and processes and more specifically to a flip-chip assembly method using wire bonding.

BACKGROUND OF THE INVENTION

In the past as well as today, the majority of semiconductor chips are encapsulated in plastic packages before they are attached to substrates or motherboards. A smaller yet rapidly growing number of semiconductor chips is assembled directly onto substrates in a technology called flip-chip. The principal features of this direct-chip-attach method are depicted in FIG. 1. The integrated circuit (IC) of a semiconductor chip 10 requires bonding pads 11 with a multi-layer metallization and solder material 12, usually referred to as bumps or balls, even if they are not strictly spherical (they may actually more resemble half-domes, semi-spheres, or truncated cones). For better tolerance of thermomechanical stress, these solder balls contain often enough solder material to resemble columns or hour-glasses with concave surface contours. In the standard process, the chip is flipped upside down, brought in contact with contact pads 13 on the first surface of substrate 14, and subjected to the melting temperature of the solder alloy so that the solder reflows. After cooling, the chip 10 is attached to the substrate 14. The gap between the chip and the substrate and the space between the solder joints has to be filled with plastic underfill material 15 in order to mitigate thermomechanical stress and reduce reliability risks on the solder joints. Conductive routing strips are integral with substrate 14. They connect the contact pads 13 to terminal pads 16 on the second surface of substrate 14. Solder balls 17 are disposed on terminal pads 16 for connection to motherboards. The overall assembly of FIG. 1 lends itself to the fabrication of so-called chip-scale with substantially the same outline between chip and substrate. Unfortunately, these packages suffer from the drawback that, in operation and temperature excursions, they are sensitive to thermomechanical stress due to the mismatch between the coefficients of thermal expansion of the semiconductor material and the substrate material.

These reliability risks, as well as the requirements for special pad metallizations, have been described in a series of detailed publications by the International Business Machines Corporation in 1969 (IBM J. Res. Develop., Vol. 13, pp. 226–296): P. A. Totta et al., SLT Device Metallurgy and its Monolithic Extension, L. F. Miller, Controlled Collapse Reflow Chip Joining, L. S. Goldmann, Geometric Optimization of Controlled Collapse Interconnections, K. C. Norris et al., Reliability of Controled Collapse Interconnections, S. Oktay, Parametric Study of Temperature Profiles in Chips Joined by Controlled Collapse Techniques, B. S. Berry et al., Studies of the SLT Chip Terminal Metallurgy.

Based on these publications, FIG. 2 illustrated the detail of the metallurgical requirements for the integrated circuit bonding pads 10. A semiconductor chip 10, typically silicon, is protected by a dielectric protective overcoat 20, usually silicon nitride, and a patterned metallization 21 over the aluminum 22 of the circuit bonding pads. Metallization 21 usually consists of a sequence of thin layers, typically a refractory metal 21a, such as chromium, titanium, or tungsten, in contact with the aluminum 22, followed by a solderable metal 21b, such as gold, copper, nickel, or palladium. Finally, solder bump 12 is formed by reflowing the deposited (evaporated or plated) solder alloy. As mentioned, these solder bumps assume various shapes after attaching the chip to the substrate, influenced by the forces of surface tension during the reflow process. The overall process depicted in FIGS. 1 and 2 is expensive, since at least ten process steps are involved: Sputter chromium and copper (or nickel or any of a wide selection of metals described in the literature); spin resist; bake; expose; develop; etch metal; remove resist; seed solder; evaporate or plate solder; reflow solder; flip-chip attach.

During actual operation of the assembly of FIG. 1, significant temperature differences and temperature cycles between semiconductor chip 10 and substrate 14 will appear. Consequently, the reliability of the assembly in FIG. 1 is strongly influenced by the coefficients of thermal expansion of the semiconductor and the substrate. For example, there is more than one order of magnitude difference between the coefficients of thermal expansion of silicon and FR-4. This difference causes thermomechanical stresses which the solder joints 11, 12 and 13 of FIG. 1 have to absorb. Detailed calculations, in the literature references cited above and in others, of the optimum height and volume of the solder joint and the expected onset of thermal fatigue and cracking showed that it is desirable to have

- a highly ductile solder;
- a high ultimate shear strength of the chip/joint and substrate/joint interfaces;
- a large value for the ratio (radius of bump-to-chip contact)/(distance to neutral point of chip).

With the onging trend to increase chip sizes and to reduce area consumption for bonding pads, both driven by cost reduction efforts, the latter goal is obtained ever less and has to substituted by other improvements.

One method aims at absorbing part of the thermomechanical stress on the solder joints by plastic material surrounding the joints and filling the gap between chip and substrate (designated 15 in FIG. 1). See for instance, U.S. patent application Ser. Nos. 60/084,416, 60/084,440, and 60/084,472, filed May 6, 1998 (Thomas et al., Low Stress Method and Apparatus of Underfilling Flip-Chip Electronic Devices). However, this method is expensive, because it represents an additional process step, and it may not be welcome since the customer may have to perform the process after device attachment to the motherboard.

Another method aims at elongating the solder joint after assembly into a column with concave surface contours. However, this method is constrained by solder volume and manufacturability.

Another method aims at intentionally sacrificing solder joints located in extreme locations (for instance, in chip corners) where the stress is highest, in order to save the majority of joints from failure. However, this method consumes valuable semiconductor real estate and it thus expensive; it is generally more a defense against the problem than an avoidance of the problem.

Another method aims at designing electrical redundancy of chip input/output terminals; see for instance U.S. patent application Ser. No. 60/080,122, filed Mar. 31, 1998 (Ibnabdeljalil et al., Electrical Redundancy for Improved Mechanical Reliability in Ball Grid Array Packages). However, this method consumes valuable input/output terminals and semiconductor real estate, and is thus expensive; it is generally more a defense against the problem than an avoidance of the problem.

Consequently, an urgent need has therefore arisen for a coherent, low-cost method of fabricating flip-chip assembly of semiconductor devices offering a fundamental solution for thermomechanical stress reliability. The method should be flexible enough to be applied for different semiconductor product families and a wide spectrum of design and process variations, should allow the usage of various formulations of substrate material, and should achieve improvements toward the goal of small outline and low profile packages. Preferably, these innovations should be accomplished using the installed equipment base so that no investment in new manufacturing machines is needed.

SUMMARY OF THE INVENTION

The present invention provides a method of assembling a semiconductor device; it especially relates to high density, high speed integrated circuits in packages which have an outline similar to the integrated circuit chip itself, and a low profile. These circuits can be found in many device families such as processors, digital and analog devices, certain memory and most logic devices, high frequency and high power devices, especially in large chip area categories. The invention helps to alleviate the space constraints in continually shrinking applications such as cellular communications, pagers, hard disk drives, laptop computers and medical instrumentation.

In accordance with the present invention, a method to modify the commonly practiced wire bonding technology is provided such that it enables the uncomplicated formation of wire loops with both ends of the loop attached to the same circuit bonding pad. A plurality of loops of uniform height can then be used for attaching the chip to a substrate using solder which is wetting the wires. The links are flexible and stress-insensitive and can thus replace solder bump connections in flip-chip applications.

It is an object of the present invention to be applicable to a variety of different semiconductor chip-scale package designs, for example chip attached to individual substrate and molded; chip attached directly to motherboard; chips with peripheral bonding; chips with centerline bonding; large-area chips or small-area chips.

Another object of the present invention is to provide a method and system for assembling chip-scale devices with low overall profile.

Another object of the present invention is to provide a method for attaching the chip to the substrate without the need for additional bonding pad metallization and without the need for stress-absorbing underfill in the gap between chip and substrate.

Another object of the present invention is to improve product quality by process simplification, and to enhance reliability assurance by controlling thermomechanical stress, minimizing moisture absorption, and general in-process control at no extra cost.

Another object of the present invention is to introduce assembly concepts for thin profiles which are flexible so that they can be applied to many families of semiconductor products, and are general so that they can be applied to several future generations of products.

Another object of the present invention is to reach these goals while minimizing the cost of capital investment and the movement of parts and product in the equipment.

These objects have been achieved by the teachings of the invention concerning methods suitable for mass production. Various modification have been employed for the assembly of semiconductor chips and insulating substrates, as well as encapsulation techniques.

In one embodiment of the present invention, the wire loops are formed on each bonding pad of an individual semiconductor chip, of uniform height and oriented perpendicular to the chip circuit surface. In another embodiment, the chip is firmly attached to an individual substrate by reflowing the solder material on each contact pad of the substrate, or by using conductive adhesive material.

In yet another embodiment of the present invention, the wire loops are formed on each circuit of a whole semiconductor wafer. In a wafer-level assembly, the wafer is then solder-attached to a substrate at least the size of the whole wafer. After transfer molding encapsulation, individual devices are singulated by sawing the wafer, thus creating true chip-size devices.

In yet another embodiment of the present invention, the wire loops are formed on each bonding pad of an individual semiconductor chip which is thereafter attached directly to a motherboard using direct-chip-attach solder or conductive adhesive techniques.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to high frequency, high speed integrated circuit (IC) assembly and packages having both a small outline and a low profile. As defined herein, the term outline relates to the overall width and length of, for example, the entire IC package. The outline of the IC package is also referred to as the footprint of the IC package, because it defines the surface area on a motherboard that the IC package will occupy. Outline will be measured in, for example, square millimeters. As defined herein, the term profile refers to thickness or height of, the IC package. The profile will be measured in, for example, millimeters. As defined herein, the term substantially the same refers to the relative outlines of the substrate and the semiconductor chip, which are within less tan about 10% of one another. In embodiments where the chip and the substrate have the same outlines, the package is referred to as a chip-size package. Importantly, the term substantially the same does not indicate which of the two components is larger, as either form is encompassed by the present invention.

Figure 3:
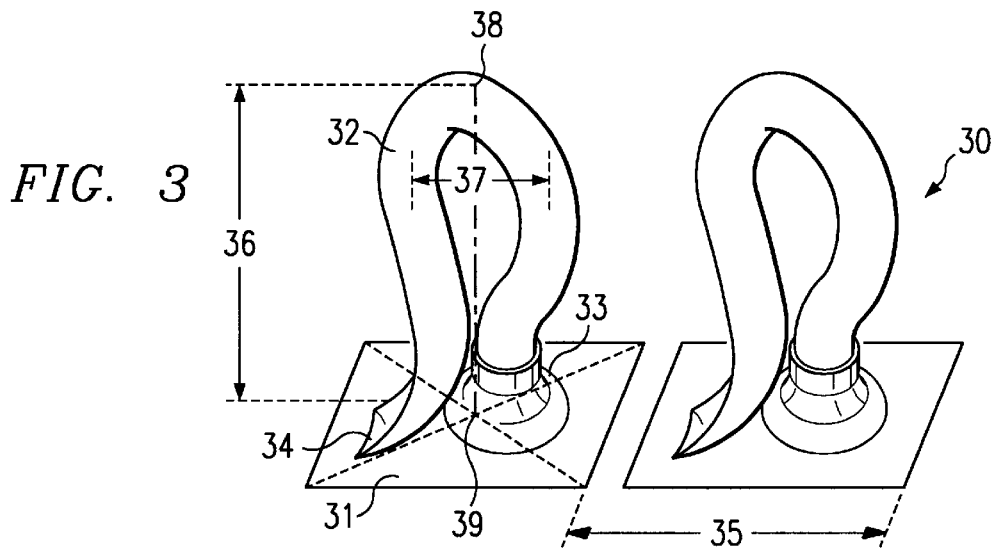
FIG. 3 is a simplified perspective view of an individual wire loop formed and attached to a circuit bonding pad according to an embodiment of the invention.

FIG. 3 depicts an individual wire loop, generally designated 30, as it is formed and attached to an individual IC bonding pad according to the invention. The IC is fabricated into the active surface of a semiconductor chip made of silicon, silicon germanium, gallium arsenide, or any other semiconductor material used in electronic device production. In the case of silicon ICs, the thickness of the chip is typically 225 to 475 μm, and the chips may belong to product families such as digital signal processors (DSP), application-specific ICs (ASIC), logic circuits (LOGIC), dynamic random-access memories (DRAM), static random-access memories (SRAM), erasable progammable read-only memories (EPROM), and many other integrated circuit components. Bonding pad 31 is shaped as a rectangle or a square with a side length of about 40 to 150 μm, preferably 90 to 100 μm. The pitch 35 between neighboring bonding pads is typically in the range from 50 to 200 μm, for chips with high numbers of input/output terminals preferably between 50 and 75 μm. The bonding pad is surrounded by a protective passivation overcoat made of moisture-impermeable silicon nitride (layer thickness usually 0.5 to 1.0 μm).

Figure 1:
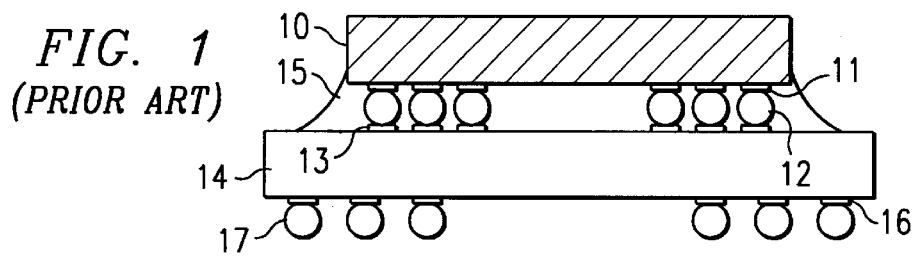
FIG. 1 is a schematic and simplified cross section of a flip-chip assembly with solder bumps, as fabricated by known technology.
Figure 2:
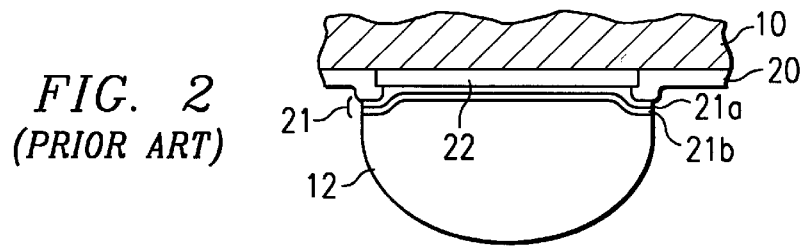
FIG. 2 is a schematic cross section of a solder bump and undermetal arrangement over the chip bonding pad metallization according to known technology.

Bonding pad 31 is most frequently made of aluminum, often alloyed with 0.5 to 2% copper and/or 0.5 to 1% silicon. The metal layer is about 0.4 to 1.0 μm thick. It is a major advantage of the present invention that the standard bond pad metallization can be used as it is fabricated today in mass production, and does not have to be specially modified. Under the aluminum (not shown in FIG. 1) is frequently a thin layer (4 to 20 μm thick) of titanium, titanium nitride, titanium tungsten, tantalum, tantalum nitride, tantalum silicon nitride, tungsten nitride, or tungsten silicon nitride. Under the conductive layers are insulating layers, frequently silicon nitride. With the recent trend towards dielectric materials of lower dielectric constants, films made of silicon-containing hydrogen silsesquioxane (HSQ), aerogels, organic polyimides and parylenes are also used in spite of the fact that they are less dense and mechanically weaker than previous standard insulators such as the plasma-enhanced chemical vapor deposited dielectrics. Also, stacks of dielectric layers may be used such as alternating layers of plasma-generated tetraethylorthosilicate (TEOS) oxide and HSQ, or ozone TEOS oxide and HSQ.

Alternatively, bonding pad 31 may comprise copper (about 0.2 to 1.0 μm thick), covered with a thin film of bondable metal such as palladium, gold or nickel.

In order to strengthen the bond pad mechanically for the conventional thermosonic wire bonding, reinforcing structures are sometimes placed under the bonding pad (not shown in FIG. 3). Descriptions may be found in U.S. patent application Ser. No. 08/847,239, filed May 1, 1997 (Saran et al., System and Method for Reinforcing a Bond Pad), and U.S, Provisional Patent Applications Serial # 60/085,876, filed May 18, 1998 (Saran et al., Fine Pitch System and Method for Reinforcing Bond Pads in Semiconductor Devices) and Serial # 60/092,961, filed Jul. 14, 1998 (Saran, System and Method for Bonding over Active Integrated Circuits).

In FIG. 3, the bonding wire consists of the wire length 32, the ball bond 33 (shown in so-called nail head configuration), and the stitch bond 34. In the preferred embodiment of the invention, standard round wire of diameter between about 18 to 33 μm is used, preferably 20 to 25 μm. For bonding to aluminum pads, the wire consists of gold, with optional very small contents of beryllium, copper, palladium, iron, silver, calcium or magnesium (which are sometimes employed to control the heat-affected wire zone in ball formation, which would be mechanically weak for bending or other deformation stresses —a parameter not essential for the present invention). For bonding to copper pads, the wire consists of copper of comparable diameter.

The wire material has to be wettable by solder, solder paste, or conductive adhesive, without the use of flux.

The wire bonding process begins by positioning the semiconductor chip on a heated pedestal to raise the temperature to between 170° and 300° C. The wire is strung through a heated capillary where the temperature usually ranges between 200 to 500° C. At the tip of the wire, a liquid ball is created using either a flame or a spark technique. The ball has a typical diameter from about 40 to 70 μm. The capillary is moved towards the chip bonding pad 31 and the ball is pressed against the metallization of the pad. For pads of aluminum, a combination of compression force and ultrasonic energy create the formation of gold-aluminum intermetallics and thus a strong metallurgical bond. The compression (also called Z- or mash) force is typically between about 17 and 75 g; the ultrasonic time between about 10 and 20 ms; the ultrasonic power between about 20 and 50 mW. At time of bonding, the temperature usually ranges from 150° to 270° C. In the case of copper wire on copper pad, only metal interdiffusion takes place in order to generate the strong weld.

Alternatively, both wire ends can be wedge bonded to the same bonding pad.

It is important for the present invention that recent technical advances in wire bonding allow the formation of small yet reliable ball contacts and tightly controlled shape of the wire loop. Such advances can, for instance, be found in the computerized bonder 2540 by Kulicke & Soffa, Willow Grove, Pa., U.S.A., or in the ABACUS SA by Texas Instruments, Dallas, TEX., USA Moving the capillary in a predetermined and computer-controlled manner through the air will create a wire looping of exactly defined shape. For instance, with the recent technical advances, rounded, trapezoidal, linear and customized loop paths can be formed. Finally, the capillary reaches its desired destination; for the present invention, this is the same bonding pad from which the bonding operation originally started (in FIG. 3, pad 31). The capillary is lowered to touch the pad; with the imprint of the capillary, a metallurgical stitch bond is formed, and the wire is flamed off to release the capillary. Stitch contacts are small yet reliable; the lateral dimension of the stitch imprint is about three times the wire diameter (its exact shape depends on the shape of the capillary used, such as capillary wall thickness and capillary footprint). Consequently, the area of bonding pad 31 in FIG. 3 can be designed small yet so that both the ball and the stitch of the wire bond can be placed on it without affecting the surrounding border of the protective silicon nitride layer.

An example of the wire loop formed by the capillary under computer control is shown in FIG. 3. The loop has a major diameter, or height, 36 and a minor diameter 37. The major diameter 36 is in the range from about 50 to 250 μm, with a preferred height of about 90 to 110 μm. The height has to be controlled to within ±2 to 5 μm. The same limiting tolerance applies to the height of all loops in an array of wire loops. As defined herein, an array of wire loops is called of uniform height, if the height of each wire loop exhibits this tolerance. Narrow loops with a shape more elongated than a circle are preferred, but minor diameters 37 of at least four times the wire diameter are preferred.

When chips with this range of major and minor diameters are attached to substrates, the wire loops will exhibit sufficient elasticity to act as stress-absorbing springs. The loops have a geometry designed to accommodate bending and stretching far beyond the limit which simple elongation of the wire material would allow, based on the inherent wire material characteristics. Consequently, the greater contribution to the stress-absorbing capability of the loops derives from geometrical flexibility and the smaller contribution from material characteristics.

Figure 3A:
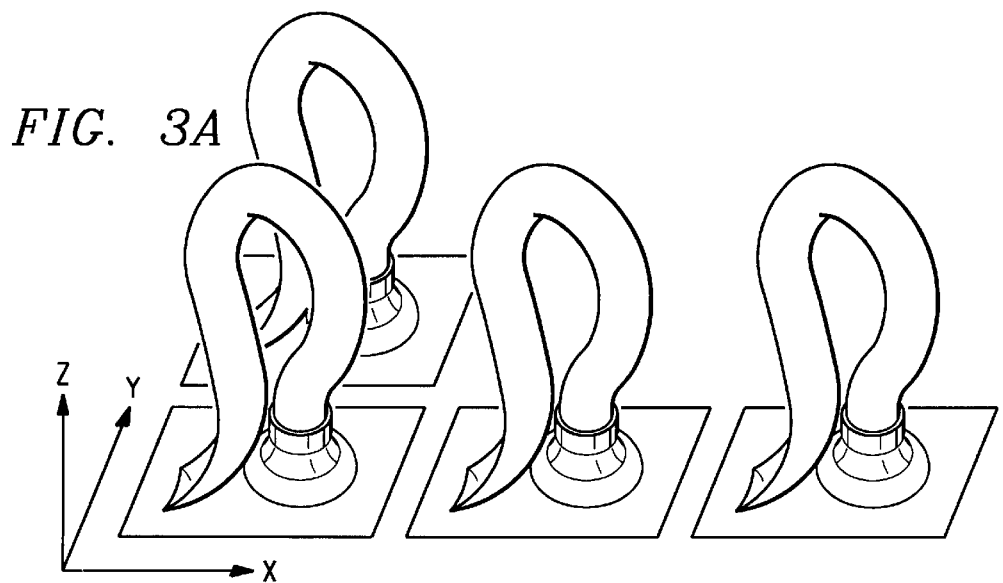

The preferred orientation of the major diameter is substantially perpendicular to the plane of the bonding pad, which is the plane of the active surface of the chip containing the IC. Further, it is essential that all loops are oriented parallel with regard to the plane of the opening, as indicated in FIG. 3A by the orientation of the loops arrayed in the X-axis and the Y-axis —a situation as it would arise at the corner of a chip. In addition, any offset of the loop apex 38 versus the bonding pad center 39 (connected by dash-dotted line in FIG. 3) needs to be constant in direction as well as magnitude from loop to loop (in order to enable alignment with the substrate contact pads during assembly). In FIG. 3, this offset is zero.

Figure 4:
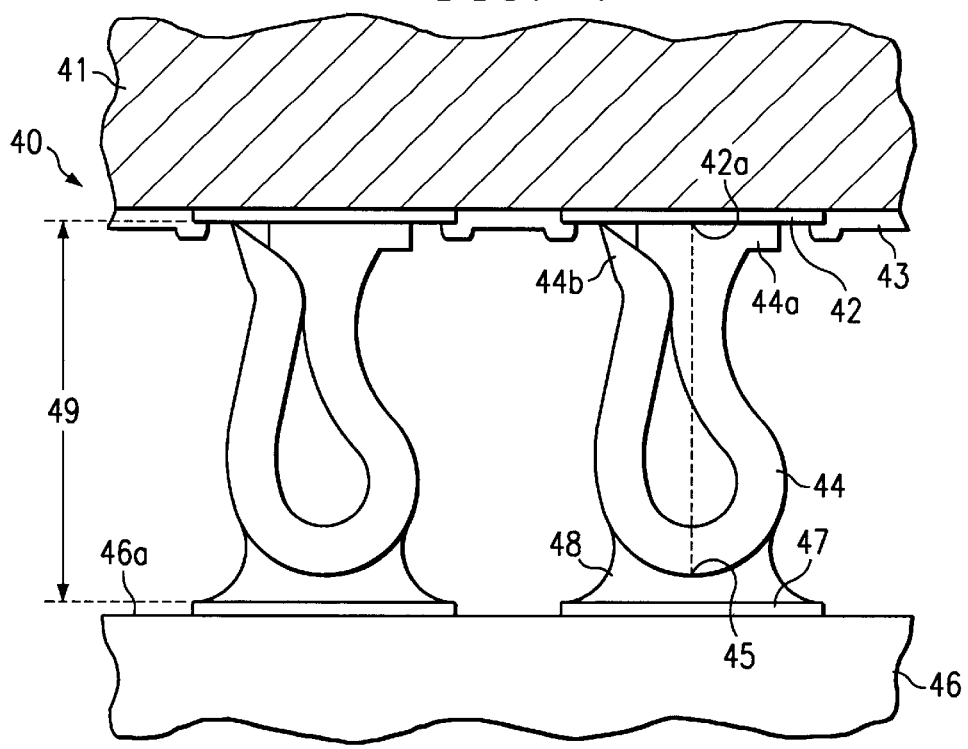
FIG. 4 is a simplified and schematic cross section of a portion of a semicondcutor chip with wire loops attached to the bonding pads and soldered to the contact pads of a substrate, as another embodiment of the invention.

FIG. 4 illustrates the assembly, generally designated 40, of a chip to a substrate as an embodiment of the present invention. FIG. 4 is a simplified and schematic cross section through a portion of chip 41 comprising bonding pads 42 and surrounding protective overcoat 43. Wire loops 44 are bonded to the bonding pads 42, each loop with one ball 44a and one respective stitch 44b of the wire welded to the bonding pad metallization. The loops have a major and a minor diameter, as explained in FIG. 3, with the major diameters defining the height of the loops, which fall within the tight tolerance indicated in FIG. 3 so that the loops of the array exhibit uniform height.

Furthermore, the major diameter of all loops is substantially perpendicular to the plane of the active chip surface. As FIG. 4 shows, all loops 44 are oriented parallel with regard to the plane of the opening. The center 42a of the bonding pad and the apex 45 of the loop have an offset of zero in FIG. 4 (they can be connected by the perpendicular dashed line); if in a device, however, that offset is non-zero, it must be constant in direction and magnitude from loop to loop in order to enable satisfactory alignment between the loops and the respective contact pads on the substrate.

In FIG. 4, substrate 46 has a plurality of contact pads 47 disposed on its first surface 46a. Usually, they consist of copper with a flash of gold. However, if metal interdiffusion with the solder it to be kept at a minimum, a thin layer of refractory metal (titanium or titanium-tungsten alloy, 40 to 700 μm thick, preferred 50 μm) may be deposited over the copper layer, followed by a layer of platinum or platinum-rich alloy (200 to 800 μm thick, preferred 500 μm). On its second surface (not shown in FIG. 4, but in related FIGS. 5 and 6) is disposed a similar plurality of contact pads disposed. These pads serve as contacts for attachment material 48. Typical attachment materials are any of the numerous lead and tin mixtures (the solder alloy is selected based on its melting temperature convenient for the device application), solder pastes, and conductive (for instance, silver-filled) adhesives.

The attachment material should wet the wires, but should enable reliable attachment without the need of flux. The attachment material may fill the opening of the loops partially without impeding the spring-like elasticity of the loops. For some embodiments it is preferred to select the attachment materials, especially solders, so that they are compatible with multiple reflow. This feature also facilitates rework.

Substrate 46 is made of insulating (commonly organic) material and is selected from a group consisting of FR-4, FR-5 and BT resin. Integral with the substrate is a plurality of electrically conductive routing strips. FR-4 is an epoxy resin, or a cyanate ester resin, reinforced with a woven glass cloth. It is available from Motorola Inc., USA, or from Shinko Corp., Japan. or from Ebinden Corp., Japan. FR-5 and BT resin are available from the same commercial sources. When selecting the material for the substrate, four parameters should be considered, namely the coefficient of thermal expansion (CTE), glass transition temperature, thickness, and dielectric constant.

The CTE for FR-4 is about 16 ppm/°C.; CTE for silicon is about 2 ppm/°C. This difference in CTE between substrate 46 in FIG. 4 made from FR-4 and the silicon chip 41 can lead to failure of devices when conventional solder bumps or balls are used due to thermomechanical stresses during the assembly steps and/or during the use of the device. It is a major advantage of the present invention that in embodiments as shown in FIG. 4 (and FIGS. 5 and 6), the wire loops are tolerant for thermomechanical stresses and CTE differences as cited above can be accepted.

The temperature at which a resin changes from a glass-like state into a "rubbery" state is generally designated as the glass transition temperature Tg. Standard FR-4 is made with a bifunctionally polymerizing epoxy that has a Tg of about 110° C. Higher Tg temperatures may be obtained by using tetrafunctional epoxy. For higher Tg values, in the range of 150 to 200° C., a cyanate ester/epoxy blend can be used. Additionally, polyimides provide for substrates having a Tg above 250° C.

Thickness is dependent on the number of layers required and the amount of reinforcement used in a given layer. The reinforcing glass cloth can range in thickness from, for example, 50 μm per sheet (type 106) to about 200 μm per sheet (type 7628).

Dielectric constant is determined by a combination of the resin used and the thickness and type of reinforcement used. Standard FR-4 has a dielectric constant of about 4.5. This constant can be reduced to about 3.0 by replacing the epoxy resin with a cyanide ester resin. The greater the thickness, however, the greater the problems associated with thickness control, sawing control and rough surfaces.

The stand-off height 49 in FIG. 4 is defined as the distance between the surfaces of the chip bonding pads 42 and the substrate contact pads 47. The fact that this design parameter can be varied over a wide range, is an important consequence of the present invention and the flexibility it offers to device designers. Typical standoff heights range from about 50 to 250 μm, but values of up to 400 μm have been implemented.

Figure 5:
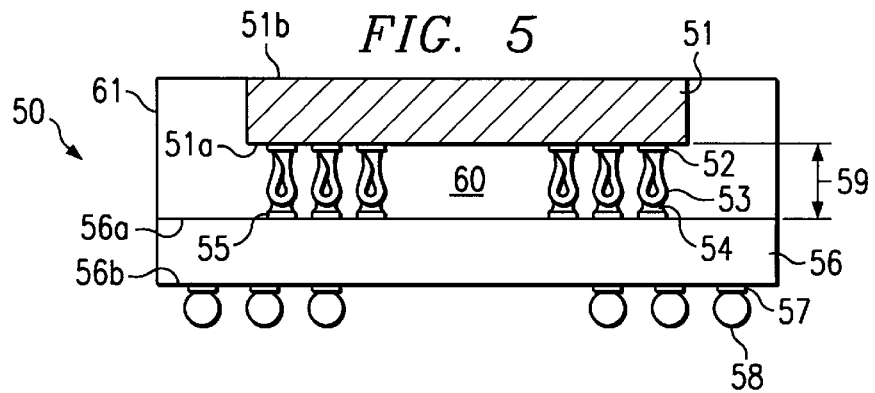
FIG. 5 is a schematic and simplified cross section of a semiconductor chip-scale device as another embodiment of the invention, singulated after a plurality of ICs have been assembled and encapsulated on a large substrate following the teachings of the invention.
Figure 6:
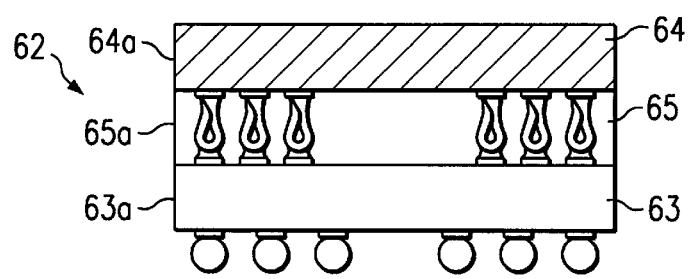
FIG. 6 is a schematic and simplified cross section of a semiconductor chip-size device as another embodiment of the invention, singulated after wafer-scale assembly of the ICs and the substrate according to the teachings of the invention.

FIG. 5 shows schematically an embodiment of the present invention, namely a chip-scale semiconductor device generally designated 50. An individual chip 51 has an active surface 51a and a passive surface 51b; the active surface includes the IC and a plurality of bonding pads 52. On each bonding pad is a wire loop 53 bonded, with its major diameter substantially perpendicular to the active chip surface. Together, these loops form an array of uniform height; all loops are oriented parallel with regard to the plane of the loop opening and have constant offsets in both direction and magnitude of their apex relative to their bonding pad centers, as described in detail in FIGS. 3, 3A, and 4. Each loop is attached using attachment or solder material 54 to a contact pad 55 disposed on the first surface 56a of electrically insulating substrate 56. In the preferred embodiment, the size of this substrate is larger than an individual chip in order to accommodate the assembly of a plurality of chips on one substrate. Contact pads 55 are connected by a plurality of electrically conductive routing strips, integral with substrate 56, to a plurality of contact pads 57 disposed on the second surface 56b of substrate 56. A solder ball 58 is attached to each of those contact pads to enable mechanical and electrical connection to motherboards. As defined herein, the term solderballs does not imply that the solder contacts are necessarily spherical. They may have various forms, such as semispherical, half-dome, truncated cone, or generally bump. The exact shape is a function of the deposition technique (such as evaporation, plating, or prefabricated units) and reflow technique (such as infrared or radiant heat), and the material composition. The solder balls are usually small in diameter, typically 0.1 to 0.3 mm; preferred solder ball diameter is 0.2 mm. Several method are available to achieve consistency of geometrical shape by controlling amount of material and uniformity of reflow temperature. When the materials are alloys of lead and tin (sometimes together with indium or silver), the reflow temperature, dependent on the composition, is commonly in the range from about 150° to 260° C.

In the first step of the attachment process, the chips with the wire loops and the substrate with the attachment material are aligned such that each wire loop is aligned with one contact pad of the substrate. Next, actual contact is established between the wire bonds of the chips and the substrate contact pads with the attachment material. In the following step, enough energy is applied to the substrate to let the attachment material reach liquid state and induce wetting of portions of the loops. If solder is used, this means melting and reflowing the solder. If conductive adhesive is used, this means active adhesion to portions of the loops. After wetting and forming reliable contact meniscus, the heating energy is removed, the attachment material cools and hardens, forming physical bonds between the substrate contact pads and the chip wire loops. Consequently, the chips are attached to the substrate while a gap 59 is formed between the chips and the substrate.

The gap 59 has approximately a width of the major diameter of loops 53. More precisely, the gap has a width of the standoff height(49 in FIG. 4) plus the thickness of the substrate metallization (55 in FIG. 5).

In order to produce the embodiment shown in FIG. 5, gap 55 is filled with encapsulation material 60, especially an epoxy-based polymer filled with silica and anhydrides. The preferred method is the transfer molding technique using a thermosetting molding compound to fill gap 59. Molding compounds are commercially available in many different specifications; they are chemically very clean and have favorable characteristics of CTE and adhesion. The transfer molding technology is at a high level of development, controllable and automated, and capable of avoiding undesirable side-effects such as wire sweep, incomplete filling, or voids. Particularly perfected is the so-called 3-P Technology; see for instance U.S. Pat. No. 5,098,626 of Mar. 24, 1992 (Pas, Method for Packing a Measured Quantity of Thermosetting Resin and Operating a Mold for Encapsulating a Component) and U.S. Pat. No. 5,431,854 of Jul. 11, 1995 (Pas, Method for Pressing a Plastic, which Cures by means of Reaction, into a Mold Cavity, a Pressing Auxiliary in Pill Form to be Used in this Method, and a Holder Composed of such Material). In the molding process, all wire loops 53, the active chip surface 51a and the substrate first surface 56a are completely covered and protected.

After the molding material is cured (polymerized), it becomes glassy hard. The composite structure can be sawed into separate devices having the contours shown in FIG. 5. The sawing lines cut the substrate into individual units assembled to the chips, and generate side surfaces 61 made of hardened molding material. The end result chip-scale semiconductor devices having contours not much larger than individual chips, and a thin profile.

In another embodiment of the invention, the aforedescribed method can be broadened to a wafer-scale assembly technology producing devices in chip-size packages. The process starts with a whole semiconductor wafer having a plurality of ICs. Wire loops are formed an all bonding pads of each IC of the wafer, controlling height, orientation, parallelity and offset of the loops in the same fashion as described above in conjunction with FIGS. 3, 3A, 4 and 5. A substrate with the features described above and having an area size suitable for assembling the whole semiconductor wafer is aligned with the wafer such that each substrate contact pad is placed into alignment with one wire loop of the chip. After contacting contact pads and loops, the attachment is achieved by the process steps described above. The resulting gap between substrate and wafer is filled with encapsulation compound preferably by transfer molding. After attaching solder balls to the substrate, as described above, the resulting composite structure is separated into discrete devices, preferably by sawing along the wafer sawing lines. The end product is a thin profile semiconductor device, depicted schematically and generally designated 62 in FIG. 6. It features a substrate 63 having the same profile as the chip 64, a true chip-size package. The side surfaces 65a of the molding compound filling 65 are in the same plane as the side surfaces 64a of the chip and 63a of the substrate.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor assembly comprising:
   a semiconductor chip having an active and a passive surface, said active surface including an integrated circuit and a plurality of bonding pads;
   said bonding pads having a metallization suitable for wire bonding;
   an array of interconnects of uniform height, each of said interconnects comprising a wire loop substantially perpendicular to said active surface, each of said loops having both wire ends attached to a bonding pad, respectively, and a major and a minor diameter, said loops being oriented parallel with regard to the plane of the opening and having constant offsets in both direction and magnitude of their apex relative to their bonding pad centers;

an electrically insulating substrate having first and second surfaces, a plurality of electrically conductive routing strips integral with said substrate, and a plurality of contact pads disposed on said first surface, with attachment material disposed on each of said contact pads;

each contact pad being attached to one of said wire loops, respectively, such that electrical contact between said chip and said substrate is established, while forming a gap therebetween having a width of approximately said major loop diameter; and encapsulation material within said gap, thereby completing the assembly.

2. The assembly according to claim 1 wherein said wire loops have sufficient elasticity to act as stress-absorbing springs.

3. The assembly according to claim 1 wherein said loops have a geometry designed to accommodate bending and stretching beyond the limit of simple elongation based on inherent materials characteristics.

4. The assembly according to claim 1 wherein said substrate contact pads comprise copper, aluminum, a refractory metal, a noble metal, or layers thereof.

5. The assembly according to claim 1 wherein said substrate is made of organic material and is selected from a group consisting of FR-4, FR-5, and BT resin.

6. The assembly according to claim 1 wherein said attachment material is selected from a group consisting of lead/tin mixture, solder paste, and conductive adhesive.

7. The assembly according to claim 1 wherein said encapsulation material is an electrically insulating epoxy-based polymer filled with silica and anhydrides.

8. The assembly according to claim 1 wherein said encapsulation material is a molding compound.

9. A method for the fabrication of a semiconductor assembly comprising the steps of:

providing a semiconductor chip having an active and a passive surface, said active surface including an integrated circuit and a plurality of bonding pads, said bonding pads having a metallization suitable for wire bonding;

forming an array of wire loops by bonding the first wire end to one of said pads, respectively, extending a length of wire while shaping it into a loop, and bonding the second wire end to the same pad, respectively;

controlling the height of said loops to maintain uniformity;

controlling the orientation of said loops to maintain perpendicularity to said active surface and parallelity to the plane of the opening;

controlling the offsets of the apex of said loops relative to their bonding pad centers to maintain constancy of direction as well as magnitude;

providing an electrically insulating substrate having first and second surfaces, a plurality of electrically conductive routing strips integral with said substrate, a plurality of contact pads disposed on said first surface, attachment material disposed on each of said contact pads, and a plurality of contact pads disposed on said second surface;

aligning said first surface of said substrate with said attachment material so that each contact pad is placed into alignment with one of said wire loops on said chip;

contacting said contact pads and said loops;

applying energy to said substrate such that its temperature increases and transfers heat to said attachment material to reach a liquid state and to wet portions of said wire loops;

removing said energy such that said attachment material cools and hardens, forming physical bonds between said contact pads and said wire loops, thereby attaching said chip to said substrate while forming a gap having a width of approximately said major loop diameter;

filling said gap with encapsulation material, whereby said wire loops, said active chip surface and said first substrate surface are protected; and attaching solder balls to each of said contact pads disposed on said second surface of said substrate.

10. The method according to claim 9 wherein said attachment material is selected from a group consisting of lead/tin mixture, solder paste, and conductive adhesive.

11. The method according to claim 9 wherein said attachment materials comprise solder mixtures with a melting temperature compatible with multiple reflow.

12. The method according to claim 9 wherein said chip bonding pads, said attachment material, and said substrate contact pads comprise a combination of materials such that metal interdiffusion is minimized.

13. The method according to claim 9 wherein said attachment material is disposed on said substrate contact pads as bumps, balls or paste.

14. The method according to claim 9 wherein said attachment wetting is achieved without flux.

15. The method according to claim 9 wherein said attachment material fills the opening of said loops partially.

16. A method for the fabrication of a semiconductor assembly comprising:

providing a semiconductor wafer having an active and a passive surface, said active surface including a plurality of integrated circuits, each circuit having a plurality of bonding pads, said bonding pads having a metallization suitable for wire bonding;

forming an array of wire loops by bonding the first wire end to one of said pads, respectively, extending a length of wire while shaping it into a loop, and bonding the second wire end to the same pad, respectively;

controlling the height of said loops to maintain uniformity;

controlling the orientation of said loops to maintain perpendicularity to said active surface and parallelity to the plane of the opening;

controlling the offset of the apex of said loops relative to their bonding pad centers to maintain constancy of direction as well as magnitude;

providing an electrically insulating substrate having first and second surfaces, a plurality of electrically conductive routing strips integral with said substrate, a plurality of contact pads disposed on said first surface, attachment material disposed on each of said contact pads, and a plurality of contact pads disposed on said second surface;

aligning said first surface of said substrate with said attachment material so that each contact pad is placed into alignment with one of said wire loops on said chip;

contacting said contact pads and said loops;

applying energy to said substrate such that its temperature increases and transfers heat to said attachment material to reach a liquid state and to wet portions of said wire loops;

removing said energy such that said attachment material cools and hardens, forming physical bonds between said contact pads and said wire loops, thereby attaching said chip to said substrate while forming a gap having a width of approximately said major loop diameter;

filling said gap with encapsulation material, whereby said wire loops, said active chip surface and said first substrate surface are protected;

attaching solder balls to each of said contact pads disposed on said second surface of said substrate;

separating the resulting composite structure into discrete chips.

17. The method according to claim 16 wherein said step of separating the composite structure comprises sawing, whereby devices in chip-size packages are produced.

* * * * *